United States Patent
Nguyen et al.

(10) Patent No.: US 6,921,555 B2
(45) Date of Patent: Jul. 26, 2005

(54) METHOD AND SYSTEM FOR SEQUENTIAL PROCESSING IN A TWO-COMPARTMENT CHAMBER

(75) Inventors: Tue Nguyen, Fremont, CA (US); Tai Dung Nguyen, Fremont, CA (US); Craig Alan Bercaw, Los Gatos, CA (US)

(73) Assignee: Tegal Corporation, Petaluma, CA (US)

( * ) Notice: Subject to any disclaimer, the term of this patent is extended or adjusted under 35 U.S.C. 154(b) by 75 days.

(21) Appl. No.: 10/212,547

(22) Filed: Aug. 6, 2002

(65) Prior Publication Data

US 2004/0026371 A1 Feb. 12, 2004

(51) Int. Cl.⁷ .............................................. C23C 16/00
(52) U.S. Cl. ............................... 427/248.1; 427/255.5; 427/569
(58) Field of Search .................... 427/248.1, 255.5, 427/569

(56) References Cited

U.S. PATENT DOCUMENTS

| | | |
|---|---|---|
| 3,921,788 A | 11/1975 | Robertson, Jr. et al. |
| 4,030,622 A | 6/1977 | Brooks et al. |
| 4,895,107 A | 1/1990 | Yano et al. |
| 5,180,434 A * | 1/1993 | DiDio et al. ................ 118/718 |
| 5,223,001 A | 6/1993 | Saeki |
| 5,223,112 A | 6/1993 | Tepman |
| 5,382,339 A | 1/1995 | Aranovich |
| 5,468,341 A | 11/1995 | Samukawa |
| 5,624,536 A | 4/1997 | Wada et al. |
| 5,648,728 A | 7/1997 | Canella |
| 5,667,592 A | 9/1997 | Boitnott et al. |
| 5,672,239 A | 9/1997 | DeOrnellas |
| 5,855,679 A | 1/1999 | Ogawa |
| 5,916,365 A | 6/1999 | Sherman |
| 5,951,770 A | 9/1999 | Perlov et al. |
| 5,968,587 A * | 10/1999 | Frankel ........................ 427/8 |
| 6,139,695 A * | 10/2000 | Washburn et al. ..... 204/192.12 |
| 6,200,893 B1 | 3/2001 | Sneh |
| 6,605,319 B1 * | 8/2003 | Chinn et al. ........... 427/255.28 |

OTHER PUBLICATIONS

PCT Written Opinion mailed Jan. 18, 2000, International Application No. PCT/US99/11453, International Filing Date May 25, 1999.

* cited by examiner

*Primary Examiner*—Bret Chen
(74) *Attorney, Agent, or Firm*—Fliesler Meyer

(57) ABSTRACT

An apparatus and method for sequential and isolated processing of a workpiece comprises a two compartment chamber and a mechanism to transfer the workpiece from a first compartment to a second compartment by rotating the workpiece on a workpiece mover through an internal pathway. The transfer mechanism comprises two doors coupled to the workpiece mover to seal the internal pathway between the first and second compartments so that the two compartments are isolated and the workpiece can be processed sequentially and in isolation. The apparatus further comprises components to enable the processing of a workpiece. The preferred method of processing a workpiece is to deposit or adsorb a thin layer in the first compartment and then transfer by rotating the workpiece on the workpiece mover to the second compartment for further processing. The workpiece can then be transferred once again to the first compartment for further processing, and again to the second compartment, repeating the processing and transferring steps until a desired thin film is achieved.

35 Claims, 8 Drawing Sheets

METHOD AND SYSTEM FOR SEQUENTIAL PROCESSING IN A TWO-COMPARTMENT CHAMBER

BACKGROUND

The present invention relates to sequential thin film processing.

The fabrication of modern semiconductor workpiece structures has traditionally relied on plasma processing in a variety of operations such as etching and deposition. Plasma etching involves using chemically active atoms or energetic ions to remove material from a substrate. Deposition techniques employing plasma include Chemical Vapor Deposition (CVD) and Physical Vapor Deposition (PVD) or sputtering. PVD uses a high vacuum apparatus and generated plasma that sputters atoms or clusters of atoms toward the surface of the wafer substrates. PVD is a line of sight deposition process that is more difficult to achieve conformal film deposition over complex topography such as deposition of a thin and uniform liner or barrier layer over the small trench or via of 0.13 μm or less, especially with high aspect ratio greater than 4:1. Plasma generation methods include parallel plate plasma, inductive coupled plasma (ICP), remote plasma, microwave plasma. In parallel plate plasma, a power source is applied across two parallel plates to create an electric field which will ionize the gas to generate the plasma. The plasma is confined between the parallel plates where the electric field is strongest, and there is significant plasma bombardment due to the presence of the electric field. In inductive coupled plasma, a power source is applied to a coil to create a magnetic field which will ionize the gas to generate the plasma. A non-conducting window such as ceramic plate could be used to separate the plasma source from the plasma. Care should be taken so that no metal is deposited on the non-conducting window, otherwise the deposited metal will block the magnetic field, and the plasma will be extinguished. This is the reason why inductive coupled plasma was not used for metal deposition. Typical parallel plate plasma and inductive coupled plasma use radio frequency (RF) power sources. In remote plasma, a plasma is generated elsewhere and then being brought to the process chamber. In microwave plasma, the plasma uses microwave frequency (MW) power source. Microwave plasma tends to be remote plasma, and is brought to the process chamber using microwave guide.

In CVD processing, a gas or vapor mixture is flowed over the wafer surface that is kept at an elevated temperature. Reactions then take place at the hot surface where deposition takes place. Temperature of the wafer surface is an important factor in CVD deposition, as it depends on the chemistry of the precursor for deposition and affects the uniformity of deposition over the large wafer surface. CVD typically requires high temperature for deposition which may not be compatible with other processes in the semiconductor process. CVD at lower temperature tends to produce low quality films in terms of uniformity and impurities.

In a deposition technology, similar to the CVD technique, known as atomic layer deposition (ALD), various gases are injected into the chamber for as short as 100–500 milliseconds in alternating sequences. For example, a first gas is delivered into the chamber for about 500 milliseconds and the substrate is heated, then the first gas (heat optional) is turned off. The residue from the first gas is then evacuated. Another gas is delivered into the chamber for another 500 milliseconds (heat optional). The residue from this gas is also evacuated before the next gas is delivered for about 500 milliseconds (and optionally heated). This sequence is done until all gases have been cycled through the chamber, each gas sequence typically forms a monolayer which is highly conformal. ALD technology thus pulses gas injection and heating sequences that are between 100 and 500 milliseconds. This approach has a high dissociation energy requirement to break the bonds in the various precursor gases such as silane and oxygen and thus requires the substrate to be heated to a high temperature, for example in the order of 600–800 degree Celsius for silane and oxygen processes.

ALD also uses radical generators, such as plasma generators, to increase the reactivity of the second gas and effectively the reaction between the first and the second gases at the substrate. U.S. Pat. No. 5,916,365 to Sherman entitled "Sequential chemical vapor deposition" provides for sequential chemical vapor deposition by employing a reactor operated at low pressure, a pump to remove excess reactants, and a line to introduce gas into the reactor through a valve. Sherman exposes the part to a gaseous first reactant, including a non-semiconductor element of the thin film to be formed, wherein the first reactant adsorbs on the part. The Sherman process produces sub-monolayer per gas injection due to adsorption. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer but is available to react with the deposited monolayer. A pump removes the excess second reactant and reaction products completing the process cycle. The process cycle can be repeated to grow the desired thickness of film.

There is other applications using plasma in ALD process. U.S. Pat. No. 6,200,893 to Sneh entitled "Radical-assisted sequential CVD" discusses a method for CVD deposition on a substrate wherein radical species are used in alternate steps to depositions from a molecular precursor to treat the material deposited from the molecular precursor and to prepare the substrate surface with a reactive chemical in preparation for the next molecular precursor step. By repetitive cycles a composite integrated film is produced. In a preferred embodiment the depositions from the molecular precursor are metals, and the radicals in the alternate steps are used to remove the ligands left from the metal precursor reactions, and to oxidize or nitride the metal surface in subsequent layers.

In one embodiment taught by Sneh, a metal is deposited on a substrate surface in a deposition chamber by (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor, (c) purging the precursor with an inert gas; (d) flowing at least one radical species into the chamber and over the surface, the radical species is highly reactive with the surface ligands of the metal precursor layer and eliminates the ligands as reaction product, and saturates the surface, providing the first reactive species; and (e) repeating the steps in order until a metallic film of desired thickness results.

In another Sneh aspect, a metal nitride is deposited on a substrate surface in a deposition chamber by (a) depositing a monolayer of metal on the substrate surface by flowing a metal precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

The Sneh embodiments thus deposit monolayers, one at a time. This process is relatively time-consuming as a thick film is desired.

Another application relating to sequential deposition is nanolayer thick film deposition ("NLD"), U.S. patent application Ser. No. 09/954,244 filed on Sep. 10, 2001 by the same inventors, Tue Nguyen et al. NLD is a process of depositing a thin film by chemical vapor deposition, including the steps of evacuating a chamber of gases, exposing a workpiece to a gaseous first reactant, wherein the first reactant deposits on the workpiece to form the thin film, then evacuating the chamber of gases, and exposing the workpiece, coated with the first reactant, to a gaseous second reactant under plasma, wherein the thin film deposited by the first reactant is treated to form the same materials or a different material. Application Ser. No. 09/944,244 is hereby incorporated by reference. The incorporation is permitted because the Ser. No. 09/954,244 co-pending application and the present application are commonly assigned to Tegal Corporation.

In comparison with CVD, atomic layer deposition (ALD or ALCVD) is a modified CVD process that is temperature sensitive and flux independent. ALD is based on self-limiting surface reaction. ALD provides a uniform deposition over complex topography and temperature independent since the gases are adsorbed onto the surface at lower temperature than CVD because it is in adsorption regime.

As discussed in Sherman and Sneh, the ALD process includes cycles of flowing gas reactant into the chamber, adsorbing one sub-monolayer onto the wafer surface, purging the gas reactant, flowing a second gas reactant into the chamber, and reacting the second gas reactant with the first gas reactant to form a monolayer on the wafer substrate. Thick film is achieved by deposition of multiple cycles.

Precise thickness can be controlled by number of cycles since monolayer is deposited per cycle. However, the conventional ALD method is slow in depositing films such as those around 100 angstroms in thickness. Growth rate of ALD TiN for example was reported at 0.2 angstrom/cycle, which is typical of metal nitrides from corresponding chlorides and $NH_3$.

The throughput in workpiece fabrication for a conventional ALD system is slow. Even if the chamber is designed with minimal volume, the throughput is still slow due to the large number of cycles required to achieve the thickness. The pump/purge cycle between gases is very time consuming, especially with liquid or solid vapors. Conventional ALD is a slower process than CVD with a rate of deposition almost 10 times as slow as CVD deposition. The process is also chemical dependent to have the proper self-limiting surface reaction for deposition. To improve the throughput, a batch system has been developed to process many wafers at the same time.

As with other sequential processing methods, the precursor gases or vapors are introduced sequentially with a pump/purge step in between to ensure the complete removal of the precursor. This pump/purge step does not contribute to the film process, therefore it is desirable if one would be able to remove this step from the processing sequence.

SUMMARY

Accordingly, a two-compartment chamber apparatus for sequential and isolated processing method is disclosed.

In a co-pending application U.S. application Ser. No. 10/213,003 by the same inventors, Tue Nguyen et al., entitled, "Two-compartment chamber for sequential processing," a two-compartment apparatus is disclosed to perform the sequential processing of a workpiece without the pump/purge step. The processing chamber comprises two compartments: the first compartment to process the workpiece using first precursors or reactants and the second compartment to process the workpiece using second precursors or reactants. These two compartments are separated by an internal pathway to allow the passage of the workpiece from one compartment to the other compartment. Instead of a pump/purge step to separate the precursors in the one-compartment chamber as in prior art methods, the present invention two-compartment chamber apparatus moves the workpiece between the compartments. The moving mechanism comprises a workpiece mover for supporting the workpiece during the movement. The moving mechanism further comprises an actuator, such as a motor, coupled to the workpiece mover to move the workpiece from one compartment to the other compartment. The moving mechanism has two end positions, at each end position, the workpiece is located in each compartment. There are two pathway doors coupled at the two ends of the workpiece mover. The pathway doors are coupled to the workpiece mover in such a way so that one of the pathway doors closes the internal pathway between the two compartments in each end position of the moving mechanism. As such, the pathway doors ensure the isolation of the compartments for processing and to prevent cross contamination from the other compartment. Since the two pathway doors are coupled to the workpiece mover, one of the pathway doors automatically closes the pathway between the compartments after the workpiece has moved completely to an end position. Application Ser. No. 10/213,003 is hereby incorporated by reference. The incorporation is permitted because the Ser. No. 10/213,003 co-pending application and the present application are commonly assigned to Tegal Corporation.

A typical sequential processing comprises the following steps:

a) A workpiece is introduced into the first compartment. The workpiece mover is at its end position, so one of the pathway doors automatically closes the internal pathway to isolate the two compartment, thus prevent the first compartment precursors or reactants from diffusing into the second compartment and contaminating the second compartment, and vice versa.

b) The workpiece is processed in the first compartment.

c) After finishing processing in the first compartment, the workpiece is moved to the second compartment until the workpiece mover is at its other end position, so one of the pathway doors automatically closes the internal pathway to isolate the two compartment, thus prevents the second compartment precursors or reactants from diffusing into the first compartment and contaminating the first compartment, and vice versa.

d) The workpiece is processed in the second compartment.

e) After finishing processing in the second compartment, the workpiece is moved to the first compartment. The sequence is then repeated until the workpiece processing is complete.

During the workpiece transfer, the pathway door is open and the two compartments are connected and a small amount of cross contamination occurs. Depending on the process requirements, a short pumping time after the completion of the workpiece transfer might be needed to remove the cross contamination. In any case, the short pumping time is shorter than the pump/purge step of the prior art. With two-compartment chamber, compartment cleaning can be selective. For example, if one compartment is used for deposition and another for treatment, only the deposition compartment needs to be cleaned.

The processing of the workpiece can be a deposition of a thin film, or an adsorption of a sub-monolayer of a plurality of precursors or reactants, or an etching of a thin layer, or a reaction, with or without an exciting source such as a plasma source, of a plurality of precursors or reactants onto the existing layers on the workpiece.

Implementations of the above aspect may include one or more of the following.

The two pathway doors coupled to the workpiece mover can be equal or smaller than the internal pathway opening. This way the workpiece mover can reside completely in one of the compartment, and the pathway door can go across the internal pathway. The advantage of this implementation is the simple design and the workpiece mover can travel widely. But the disadvantage is that the degree of isolation can be reduced if the gap between the pathway and the pathway door is too large. If the gap is too small, there can be friction, resulting in wear and tear, and possible particle generation.

The two pathway doors coupled to the workpiece mover can be larger than the internal pathway opening. Since the pathway doors are larger than the opening, the doors cannot travel across the internal pathway. Therefore the workpiece mover is positioned so that one pathway door resides within one compartment and the other pathway doors resides within the other compartment. Large pathway doors can provide better isolation for the two compartments. Better isolation can be achieved with the addition of o-ring so that the internal pathway closing is metal to o-ring seal instead of metal to metal seal.

A workpiece mover heater can be coupled to the workpiece mover. The workpiece mover heater is capable of heating the workpiece to an elevated temperature. Many processing techniques require that the workpiece be heated, from room temperature to around 400° in the cases of plasma processing, or 800° C. in the case of high temperature CVD, or 1200° C. as in the case of rapid thermal processing. The workpiece heater can provide the high temperature needed for these selected processing requirements. By coupling to the workpiece mover, the workpiece mover heater moves with the workpiece mover, therefore there is only one workpiece mover heater for the two-compartment chamber.

The movement of the workpiece mover from one compartment to the other compartment can be a rotational movement. The angle from the two pathway doors can be anywhere from a few degrees to a maximum of 180 apart, with roughly 90–100° as the desired angles to minimize the footprint of the process chamber.

The movement of the workpiece mover from one compartment to the other compartment can be a linear movement. The linear movement further comprises a linear guide coupled to the motor to guide the movement of the workpiece mover. The two pathway doors are positioned at the two ends of the movement.

The apparatus can further comprises a second actuator, such as a motor, coupled to a second linear guide to move the workpiece mover in a vertical direction somewhat perpendicular to the movement from one compartment to the other compartment. The vertical movement is designed to clear the workpiece mover of any obstacles during the compartment to compartment transfer.

The apparatus can further comprises an external pathway coupled to one of the compartment. The external pathway is designed to allow the passage of the workpiece to the outside of the workpiece processing chamber, and from the outside to the workpiece processing chamber. The external pathway can comprise an external door to isolate the process chamber from the outside ambient.

The apparatus can further comprises a plurality of workpiece heaters coupled to the processing chamber. There can be only one workpiece heater in only one compartment, or there can be two workpiece heaters, one for each compartment. The workpiece heaters are capable of heating the workpiece to an elevated temperature. The two workpiece heaters can be independent, so that one can achieve different temperature than the other. The workpiece heaters are a part of the process requirements. Some processes require that the workpiece be heated to an elevated temperature, while other processes can run at room temperature and other processes need to run below room temperature. The workpiece heater can be radiative heater such as a lamp, or resistive heater. The workpiece heater can comprises a third actuator, such as a motor, coupled to a linear guide to move the workpiece heater in a vertical direction somewhat perpendicular to the compartment to compartment movement. This vertical movement is designed to clear the workpiece mover of any obstacles during the compartment to compartment transfer. The linear guide can be coupled to the workpiece heater, and the workpiece heater can move up and down to clear the path for the workpiece mover. The linear guide can be coupled to the workpiece mover, and the workpiece mover can move up and down to clear the workpiece heater during the transfer.

The apparatus can further comprises a plurality of delivery systems coupled to the processing chamber. There can be only one delivery system in only one compartment, or there can be two delivery systems, one for each compartment. The delivery systems are capable of delivering a plurality of precursors or reactants onto the workpiece. The delivery systems are a part of the process requirements. The delivery system can be a liquid precursor delivery system to deliver a plurality of precursor vapors from a plurality of liquid precursor sources. The delivery system can be a solid precursor delivery system to deliver a plurality of precursor vapors from a plurality of solid precursor sources. The delivery system can be a showerhead to distribute the precursor vapor uniformly over a flat surface. The delivery system can be a ring to distribute the precursor vapor in a ring surrounding the workpiece. The delivery system can comprise a vaporizer to vaporize a liquid precursor or a solid precursor. The delivery system can comprise a liquid flow controller to control the amount of liquid precursor entering the process chamber. The delivery system can comprise a number of valves to control the timing of the precursor delivery.

The apparatus can further comprises a plurality of plasma sources coupled to the processing chamber. There can be only one plasma source in only one compartment, or there can be two plasma sources, one for each compartment. The plasma sources are capable of delivering a plasma onto the workpiece. The plasma sources are a part of the process requirements. The plasma can be used to excite the precursors, generating radical species, and increase the reaction rate. The plasma can be used for deposition processes, reaction processes, etching processes, or chamber clean processes. The plasma source can be an inductive coupled plasma source using radio frequency (RF). The plasma source can be a parallel plate plasma source using radio frequency (RF). The plasma source can be a remote plasma source. The plasma source can be a microwave plasma source using microwave frequency (MW).

The apparatus can further comprises a plurality of vacuum pumps coupled to the processing chamber. There can be only one vacuum pumps in only one compartment, or there can be two vacuum pumps, one for each compartment. The vacuum pumps are capable of maintaining the processing chamber at a pressure lower than atmospheric pressure. The comparment can have an isolation valve to isolate the compartment from the vacuum pump. The compartment can have a throttle valve to regulate the pressure in the compartment.

The apparatus can further comprises a plurality of workpiece bias power sources coupled to the processing chamber. There can be only one workpiece bias power source in only one compartment, or there can be two workpiece bias power sources, one for each compartment. The workpiece bias power source can be a direct current (DC) bias source, or a RF bias source. The workpiece bias power source can provide a potential bias to the workpiece to modify the path of the charged precursors, to provide bombardment to the workpiece.

In a preferred embodiment, the present invention apparatus comprises a two-compartment process chamber for sequential processing of a workpiece. The processing chamber comprises 2 compartments with each compartment having the processing equipment to process the workpiece. The processing equipment comprises a heater for heating the workpiece to an elevated temperature since many process recipes require that the workpiece is at a high temperature. The processing equipment comprises vacuum pumps to keep the process chamber at a reduced pressure. Typical process pressures are in the milliTorr range for etching conditions, and in the Torr range for deposition conditions, with 760 Torr being the atmospheric pressure. There can be one vacuum pump connected to one of the compartment, or there can be one vacuum pump connected to both compartments, or there can be two vacuum pumps connected to two compartments of the process chamber. There can be isolation valves between the compartments and the vacuum pumps to isolate the compartments from the vacuum pumps. There can be throttle valves between the compartments and the vacuum pumps to regulate the pressure in the compartments. The processing equipment comprises delivery systems to deliver precursors onto the workpiece. There can be one delivery system in one compartment, or there can be two delivery systems, one for each compartment. The apparatus is for sequential processing of a workpiece using two precursors for two compartments. Instead of a pump/purge step between the two precursors, the workpiece is moved between the two compartments. This arrangement has significant better advantages with liquid or solid precursors since the pump/purge step for vapors is much longer than gases in the prior art apparatus.

The apparatus can further comprise a plasma source, such as a microwave plasma source, to clean the compartment.

In another preferred embodiment, the present invention apparatus comprises a two-compartment process chamber for sequential processing of a workpiece with a plasma source. The processing chamber comprises 2 compartments with each compartment having the processing equipment to process the workpiece and one of the compartments having a plasma source for plasma processing. The processing equipment comprises a heater for heating the workpiece to an elevated temperature since many process recipes require that the workpiece is at a high temperature. The processing equipment comprises vacuum pumps to keep the process chamber at a reduced pressure. The processing equipment comprises delivery systems to deliver precursors onto the workpiece. The processing equipment comprises a plasma source for plasma processing of the workpiece.

The apparatus is for sequential processing of a workpiece using two precursors for two compartments with one compartment having a plasma source. The workpiece is exposed to the first precursor in the first compartment, then moves to the second compartment, and is exposed to a plasma environment with the second precursor in the second compartment. To strike a plasma, the amount of vapor needs to be minimized, therefore this arrangement has significant advantages over the pump/purge step of prior art. This arrangement is also well suited for metal deposition process with ICP plasma, since the first precursor, which is a metal precursor, will be confined in the first compartment, therefore the second compartment with the plasma is free of the metal precursor. For ICP plasma, the non-conductance window, such as a ceramic plate, needs to be free of metal for the transmission of the magnetic field for generating the plasma inside the compartment. The prior art one-compartment apparatus will require cleaning of the non-conductance window from the metal deposition for the reliable operation of the ICP plasma.

The apparatus can further comprise a plasma source, such as a microwave plasma source, to clean the first compartment.

A method of sequential process of a workpiece is disclosed. The method comprises the steps of:
  a) processing the workpiece in a first compartment;
  b) transferring the workpiece from the first compartment to a second compartment, the second compartment being isolated from the first compartment;
  c) processing the workpiece in the second compartment.

The sequence can be repeated with the steps of transferring the workpiece back to the first compartment and processing the workpiece there. This sequential process method is different from the prior art sequential or ALD processing method in which the pump/purge step between the processing steps is replaced by a workpiece movement.

The workpiece processing step in step a) in the first compartment can comprise the deposition of a thin film. The characteristic of a deposition process is that the deposited film thickness increases noticeably as a function of processing time. The thin film deposition can occur by the introduction of appropriate precursors through a delivery system in the first compartment. By exposing the workpiece to appropriate precursors under appropriate conditions, a thin film can be deposited on the workpiece. The thickness of the deposited film can be from a monolayer to hundred of nanometers, controllable by various process conditions, such as the process time. A workpiece heater in the first compartment can supply the energy needed for the deposition reaction to take place. The workpiece heater can be a radiative heater or a resistive heater. A plasma or a bias source can also be added to supply the energy needed, or to modify the process characteristics. The process pressure can be sub-atmospheric, controlled by a throttle valve connected to a vacuum pump. The process pressure can be atmospheric, depended on the processes.

The workpiece processing step in step a) in the first compartment can comprise the adsorption of a thin film. The characteristic of an adsorption process is that the adsorbed film thickness does not increases noticeably as a function of processing time. The adsorbed film saturated at a certain thickness, typical less than a monolayer, after a period of processing time. This adsorption characteristics is the characteristics of the ALD process, to ensure a very good conformality of the coated film and to ensure a consistent thickness with a wide process margin. The thickness of the adsorbed film is typical less a monolayer, and is much more difficult to control than the deposited film.

The workpiece processing step in step c) in the second compartment can comprise the reaction of a precursor on the existing film. The workpiece processing step in step c) in the second compartment can comprise the plasma reaction of a precursor on the existing film. The existing film can be from a deposition step or from an adsorption process. The presence of the plasma can fasten the reaction process to improve the throughput. The deposited or adsorbed thin film is treated to form the same materials or a different material.

Implementations of the above aspect may include one or more of the following. The workpiece can be a wafer. The plasma enhances or maintains the thin film conformality. The plasma can be a high density plasma with higher than $5 \times 10^9$ ion/cm$^3$. The reactant can be a metal organic, organic, to form a thin film of metal, metal nitride, or metal oxide. The second reactant can be exposed under high pressure above 100 mT. The first and second reactants react and the reaction creates a new compound. The thin film thickness is less than one atomic layer thickness. The thin film thickness is more than one atomic layer thickness. The thin film thickness can be between a fraction of a nanometer and tens of nanometers. The plasma can be sequentially pulsed for each layer to be deposited. The plasma can be excited with a solid state RF plasma source such as a helical ribbon electrode. The process includes pre-cleaning a surface of a workpiece; stabilizing precursor flow and pressure; exposing the workpiece to a first reactant in the first compartment, wherein the first reactant deposits or adsorbed on the workpiece to form a thin film; transferring the workpiece to the second compartment; striking the plasma; performing a plasma treatment on the deposited or adsorbed film; exposing the workpiece, coated with the first reactant, to a gaseous second reactant under the plasma treatment, wherein the thin film deposited by the first reactant is treated to form the same materials or a different material. Repeating of the steps deposits a thick film with thickness controlled by the number of repeats.

In another aspect, an apparatus to perform semiconductor processing includes a high density inductive coupled plasma generator to generate plasma; and a process compartment housing the plasma generator. The method can provide deposition of copper metal from Cu hfacI and plasma (gas), Cu hfacII and plasma (gas), CuI$_4$ and plasma (gas), CuCl$_4$ and plasma (gas), and organo metallic copper and plasma (gas); of titanium nitride from TDMAT and plasma (gas), TDEAT and plasma (gas), TMEAT and plasma (gas), TiCl$_4$ and plasma (gas), TiI$_4$ and plasma (gas), and organo metallic titanium and plasma (gas); of tantalum nitride from PDMAT and plasma (gas), PDEAT and plasma (gas), and organo metallic tantalum and plasma (gas); of aluminum oxide from trimethyl aluminum (TMA) and ozone, TMA and water vapor, TMA and oxygen, organo metallic aluminum and plasma (gas); and other oxides such as hafnium oxide, tantalum oxide, zirconium oxide; wherein gas is one of N$_2$, H$_2$, Ar, He, NH$_3$, and combination thereof.

Implementations of the apparatus can include gas distribution, chuck, vaporizer, pumping port to pump, and port for gas purge.

Advantages of the system may include one or more of the followings. The pump/purge step is minimize, especially with liquid precursors or reactants. There is no extensive pump/purge step to remove all first precursors or reactants before introducing second precursors or reactants because the first and second precursors or reactants are confined in different compartment. There can be a small amount of pump/purge to minimize the amount of cross contamination, occurring during the workpiece transfer, but this pump/purge step is significantly small. Another advantage is that the chamber cleaning step can be minimize. With the first and second precursors separated, the deposition occurring in the chamber wall is much reduced, leading to less chamber wall cleaning. This is especially useful with metal deposition using ICP plasma, since the non-conducting window of the ICP plasma has to be cleaned of metal deposit. Another advantage is the improvement of uniformity, because a showerhead can be used in the first compartment and an ICP plasma in the second compartment.

Other advantages of the system may include one or more of the followings. The ICP plasma can use a helical ribbon instead of a coil. The helical ribbon provides a highly uniform plasma and also results in a chamber with a small volume. The system enables high precision etching, deposition or sputtering performance. This is achieved using the pulse modulation of a radio frequency powered plasma source, which enables a tight control the radical production ratio in plasmas, the ion temperature and the charge accumulation. Also, since the time for accumulation of charges in a wafer is on the order of milli-seconds, the accumulation of charges to the wafer is suppressed by the pulse-modulated plasma on the order of micro-seconds, and this enables the suppression of damage to workpieces on the wafer caused by the charge accumulation and of notches caused during the electrode etching process. The system requires that the substrate be heated to a relatively low temperature such as 400 degrees Celsius.

The compartment can be used for deposition step, such as CVD deposition, ALD deposition, plasma enhanced CVD deposition, metal organic CVD (MOCVD) deposition, sputtering deposition; or for treatment step such as rapid thermal annealing, laser annealing, plasma annealing, desorption; or for etching step such as metal etch, oxide etch, atomic layer etch.

DESCRIPTION

Figure 1A:
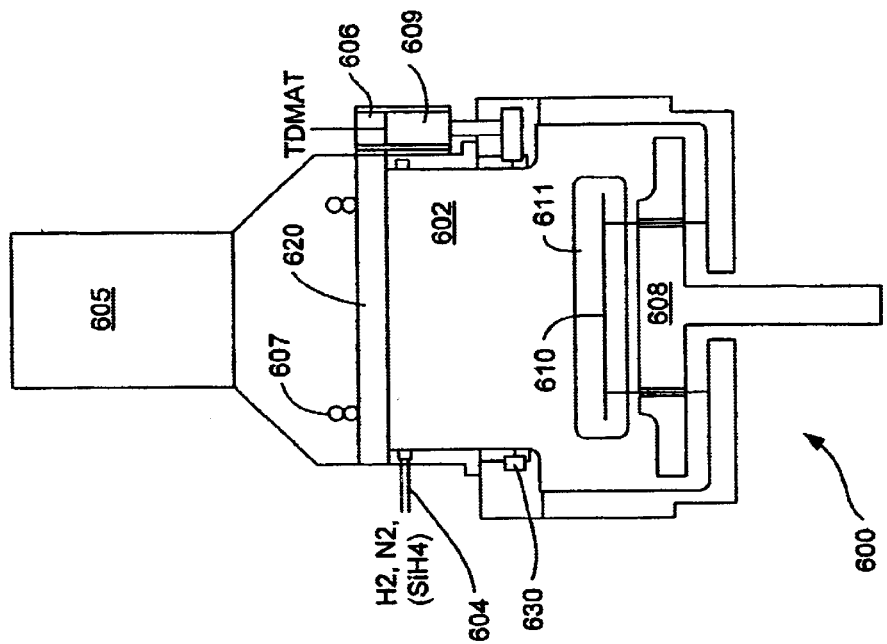
FIGS. 1A–1B show two operating conditions of a one-compartment chamber to perform plasma deposition.
Figure 1B:
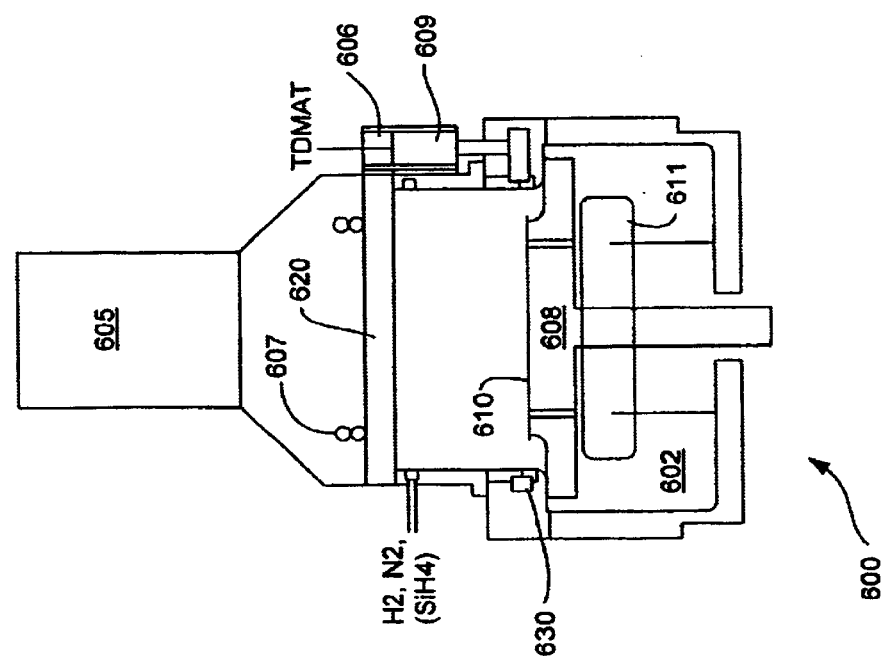

FIGS. 1A–1B show two operating conditions of an embodiment 600 to perform plasma sequential deposition as disclosed in a patent application Ser. No. 09/954,244 on Sep. 10, 2001 of the same authors, Tue Nguyen et al. FIG. 1A shows the embodiment 600 in a deposition condition, while FIG. 1B shows the embodiment 600 in a rest condition. A plasma generator 605 is mounted on top of the chamber 602 and one or more plasma excitation coils 607 are positioned near the gas inlets 604. The plasma generator configuration is an inductive coupled plasma (ICP), where a magnetic field is generated through the coil 607. The magnetic field excites the gas inside the chamber 602 to generate a plasma. A non-conductor window 620, such as a ceramic plate of alumimum oxide, seals the chamber against the outside atmosphere. The window 620 needs to be non-conducting to allow the passage of the magnetic field to generate the plasma inside the chamber 602. If a metal is deposited on the window 620, the magnetic field is blocked and the plasma generation will be affected. The plasma can be extinguished if there is too much metal blocking. This system requires a cleaning procedure to ensure that the window 620 is free of metal deposits.

The chamber 602 receives precursor gases through one or more gas inlets 604. A liquid precursor system 606 introduces liquid precursor through a vaporizer 609 into the chamber 602 using a precursor distribution ring 630.

A chuck 608 movably supports a workpiece or a substrate 610. In FIG. 1A, the chuck 608 and the substrate 610 are elevated and ready for deposition. The chamber 602 is maintained at sub-atmospheric pressure with the use of a vacuum pump (not shown). The substrate 601 can be heated using radiative heating or resistive heating through the chuck 608. Suitable processing gas is introduced into the chamber through the inlets 604, and a plasma generator 605 is turned on in accordance with a process recipe to drive the desired process. At the end of the processing, the gases in the chamber 602 are purged, the chuck 608 is lowered and the substrate 610 is removed through an opening 611.

The sequential process can be accomplished with a pump/purge step. A first precursor is introduced and the substrate is exposed to the first precursor to form a thin film. A pump/purge step is followed to remove the first precursor. Then a second precursor is introduced and the substrate is exposed to the second precursor to react with the existing thin film. In the plasma sequential chamber, a plasma is generated during the introduction of the second precursor to accelerate the reaction. Another pump/purge step is then followed to remove the second precursor. Then the sequence is repeated until the process is completed. To generate a plasma, the chamber needs to be free of precursor vapor, therefore a long pump/purge cycle is often needed. Also, to achieve a high density plasma in a large uniform area, such as for a 8' diameter semiconductor wafer, ICP plasma is the obvious choice. But to generate the plasma, the window needs to be free of metal deposit. Therefore for a metal deposition sequence, a window clean step will need to be included. The throughput of the process is significantly reduced with these pump/purge and cleaning actions.

Figure 2:
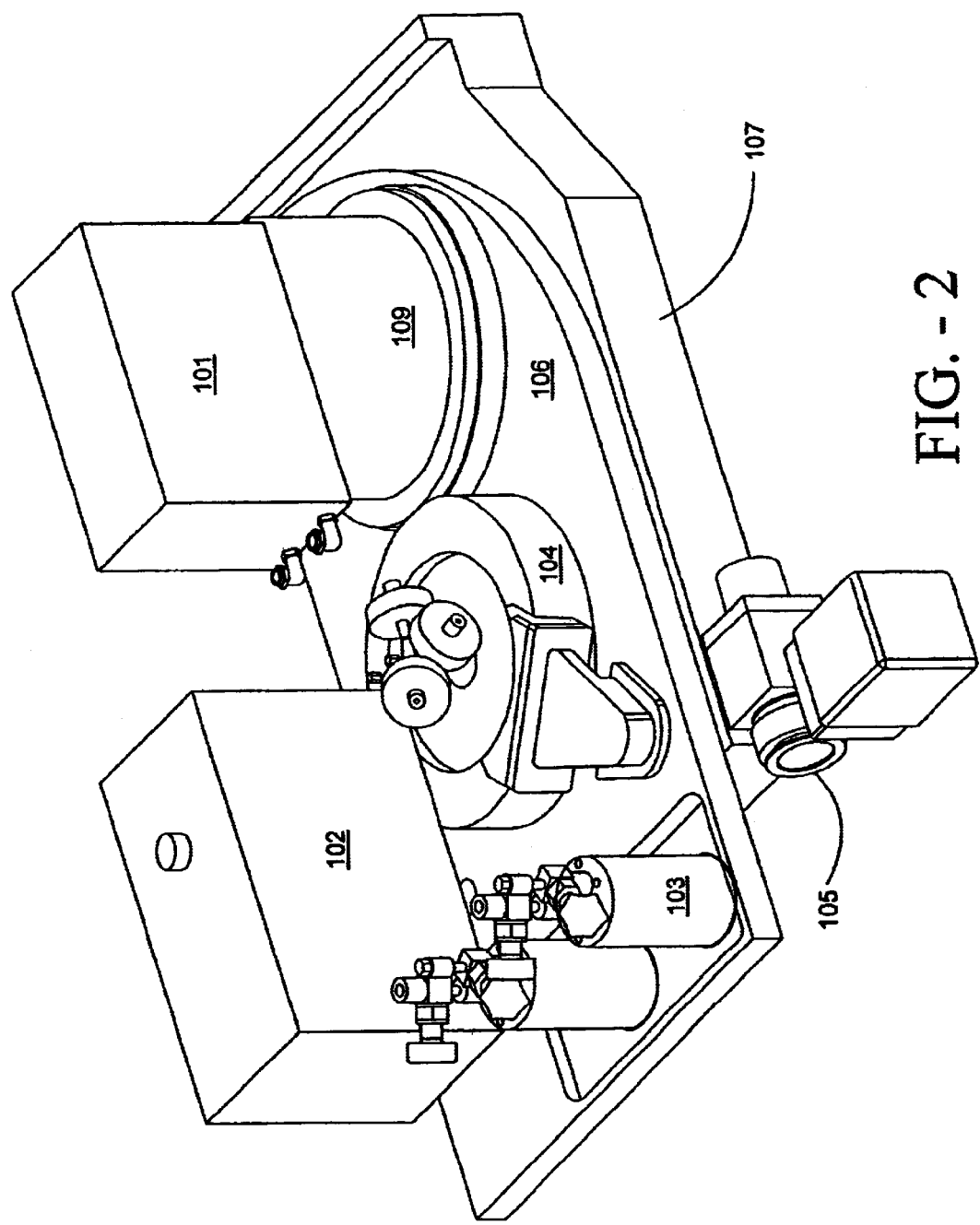
FIGS. 2A–2B show different views of an embodiment of the present invention two-compartment chamber.

FIGS. 2A–2B show different views of an embodiment of the present invention two-compartment chamber. Refer to FIG. 2A, the two-compartment chamber comprises a chamber bottom 107 and a chamber lid 106. The chamber lid 106 and the chamber bottom 107 can be separated to expose the inside of the process chamber for servicing. In one aspect, the chamber bottom 107 is fixed and the chamber lid 106 is movable. Connections to the chamber lid 106 are made through the chamber bottom 107 to prevent breaking of connections when the chamber lid 106 is moving. The vacuum connection 105 is attached to the chamber bottom 107. There is a connection between the chamber bottom and the chamber lid to connect the vacuum port to the compartment. The chamber comprises 2 compartments 104 and 109. Compartment 104 has a delivery system using a liquid precursor 103. Compartment 109 has a plasma source 101 to generate reactive precursors. Compartment 104 further has a downstream plasma source 102, preferably a microwave plasma, for chamber clean.

Figure 3:
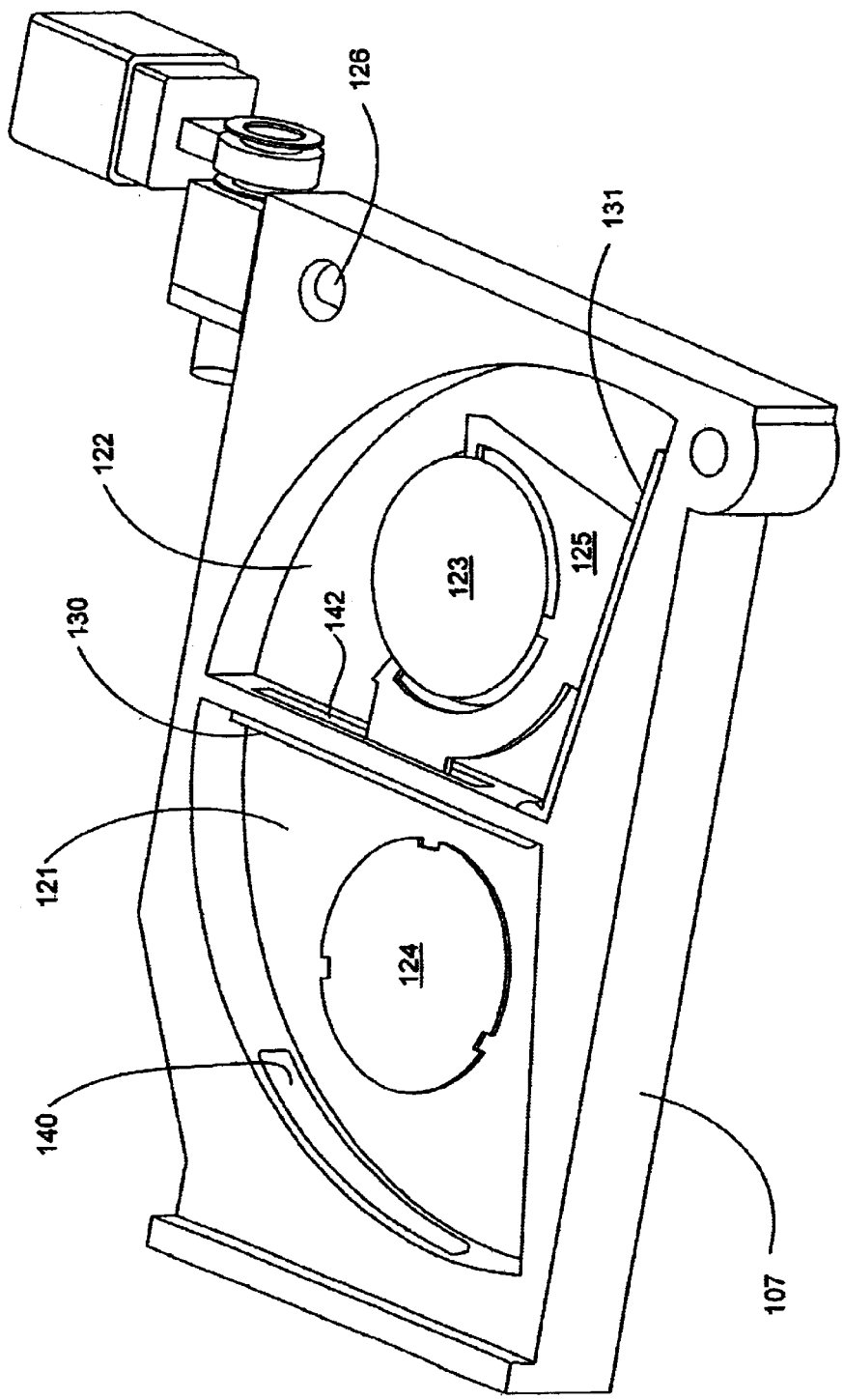
FIG. 3 shows a chamber bottom of the two-compartment chamber.

FIG. 3 shows a chamber bottom of the two-compartment chamber. The chamber bottom 107 has a vacuum connection 126. In this particular design, the vacuum connection 126 is connected to the chamber lid (not shown), and then connected to the cavity of the compartments (not shown). The chamber bottom 107 has an external pathway 140 to move a workpiece 123 in and out of the chamber. The chamber bottom 107 comprises 2 compartments 121 and 122. The 2 compartments 121 and 122 are separated by an internal pathway 142. The internal pathway 142 is large enough for the passage of a workpiece 123. The workpiece 123 is supported by a workpiece mover 125. Thw workpiece mover 125 is connected with 2 pathway doors 130 and 131. In this design, the pathway doors 130 and 131 are larger than the internal pathway 142, therefore one pathway door 130 is located in one compartment 121, and one pathway door 131 is located in other compartment 122. In this design, a workpiece heater 124 is coupled to the compartment 121 to provide heat to the workpiece 123. Another workpiece heater (not visible) under the workpiece 123 is providing heat to the workpiece 123 in the compartment 122. The compartment 122 is isolated from compartment 121 by the pathway door 130. The workpiece mover 125 can move the workpiece 123 from compartment 122 to compartment 121 by rotating counterclockwise. In the new position, pathway door 131 will close the internal pathway 142, and the two compartments will be isolated again.

Figure 4:
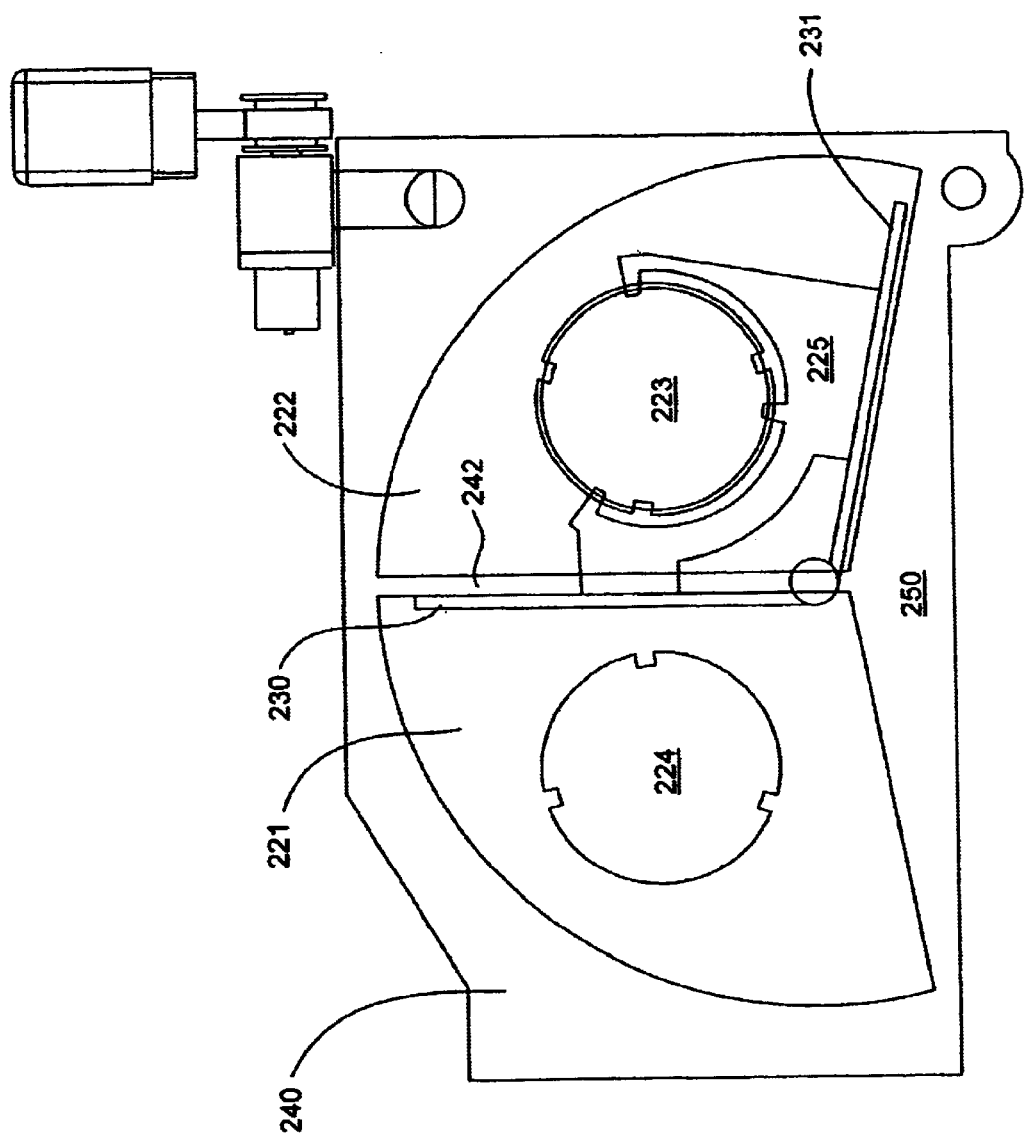
FIG. 4 shows a top view of the chamber bottom.

FIG. 4 shows a top view of the chamber bottom 250. There are two compartments 221 and 222 with a internal pathway 242. The workpiece mover 225 is supporting the workpiece 223 and is located in compartment 222. Two pathway doors 230 and 231 are coupled to the workpiece mover 225. The pathway door 230 closes the internal pathway 242 in the shown position. By rotating counterclockwise, the workpiece mover 225 can move the workpiece 223 from compartment 222 to compartment 221. In compartment 221, the pathway door 231 will close the internal pathway 242. In either position, the two compartments are isolated. Also shown are a workpiece heater 224 and an external pathway 240, both coupled to compartment 221.

Figure 5:
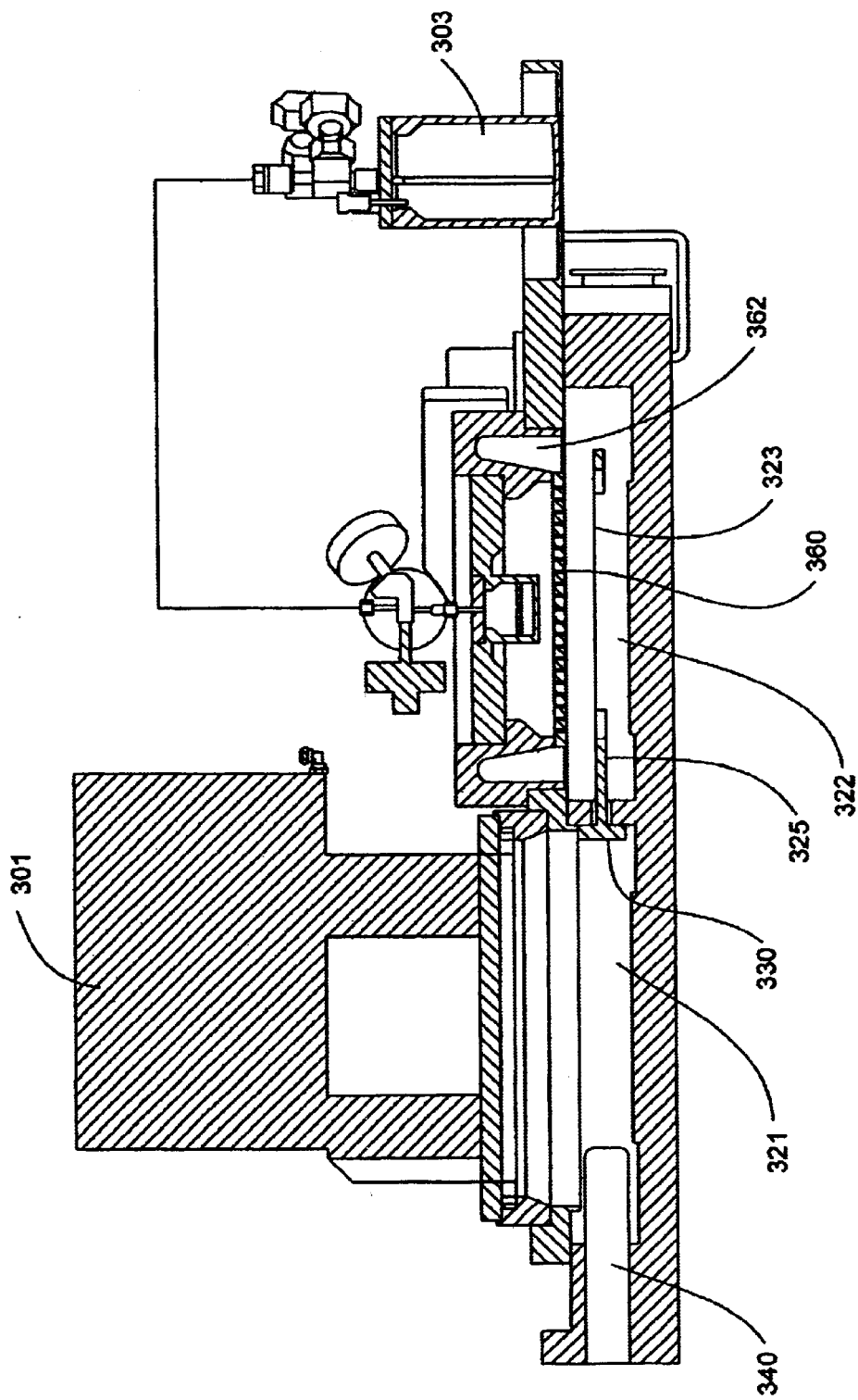
FIG. 5 shows a cross section of the two compartment chamber.

FIG. 5 shows a cross section of the two compartment chamber. The chamber comprises 2 compartments 321 and 322. A workpiece 323 is supported by a workpiece mover 325 and located in compartment 322. A pathway door 330 coupled to the workpiece mover 325 closes the internal pathway between the 2 compartments 321 and 322. A liquid precursor 303 can deliver a precursor vapor to a showerhead 360 and onto the workpiece 323. A vacuum section 362 can evacuate the gases and vapor in the compartment 322. In compartment 321, a ICP plasma source 301 can generate a plasma in compartment 321 to process the workpiece 323. A external pathway 340 can move the workpiece 323 in and out of the process chamber.

Figure 6A:
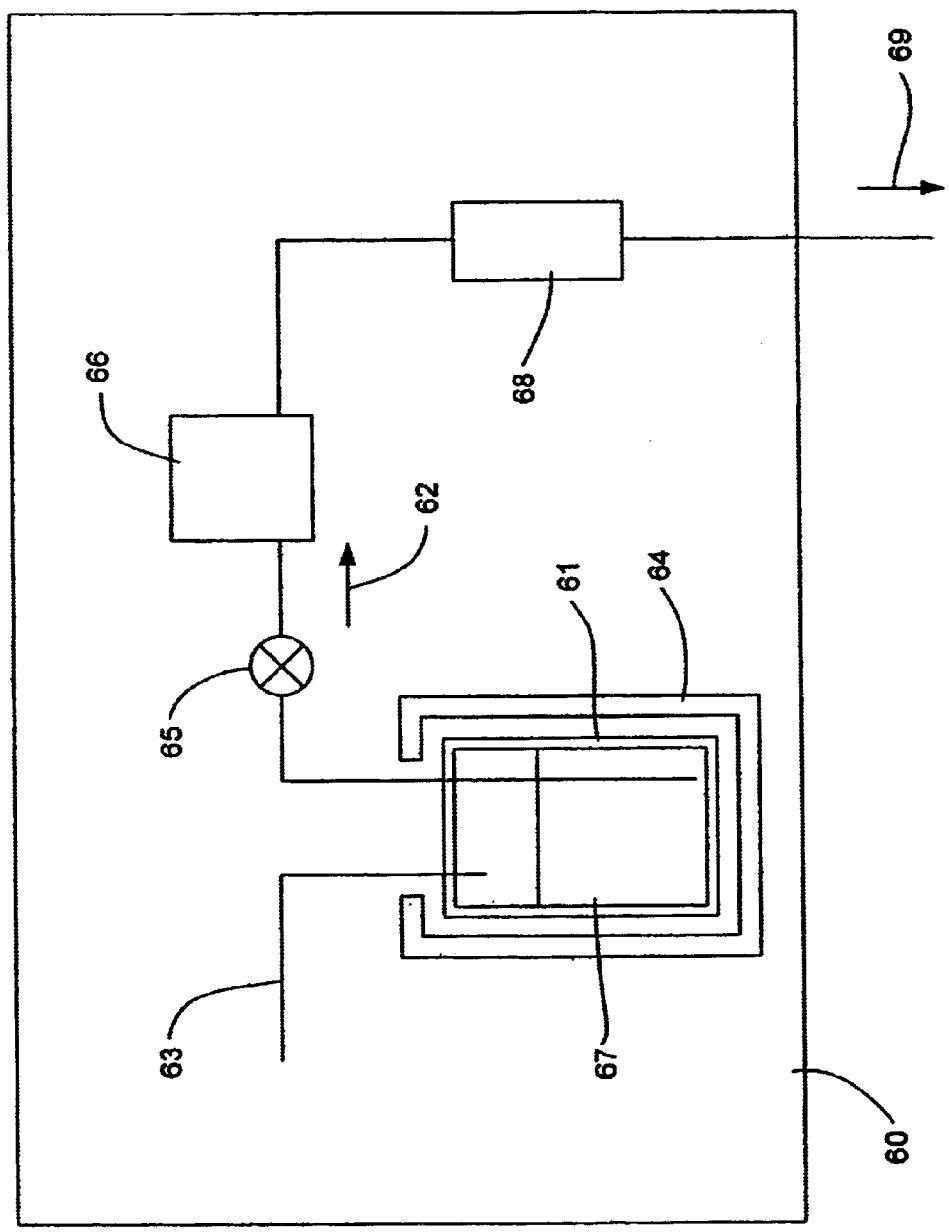
FIGS. 6A–6C show precursor delivery systems.
Figure 6B:
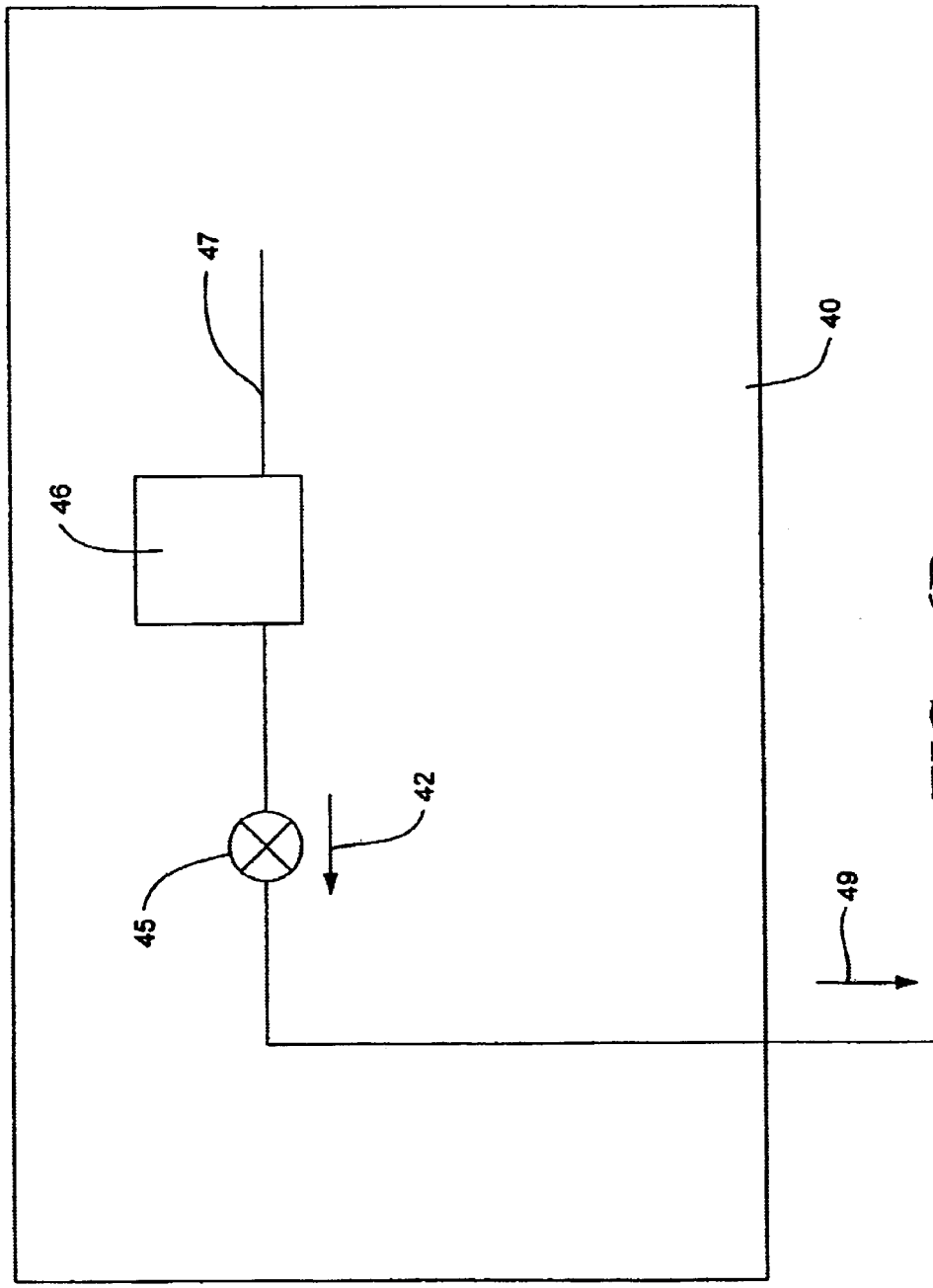
Figure 6C:
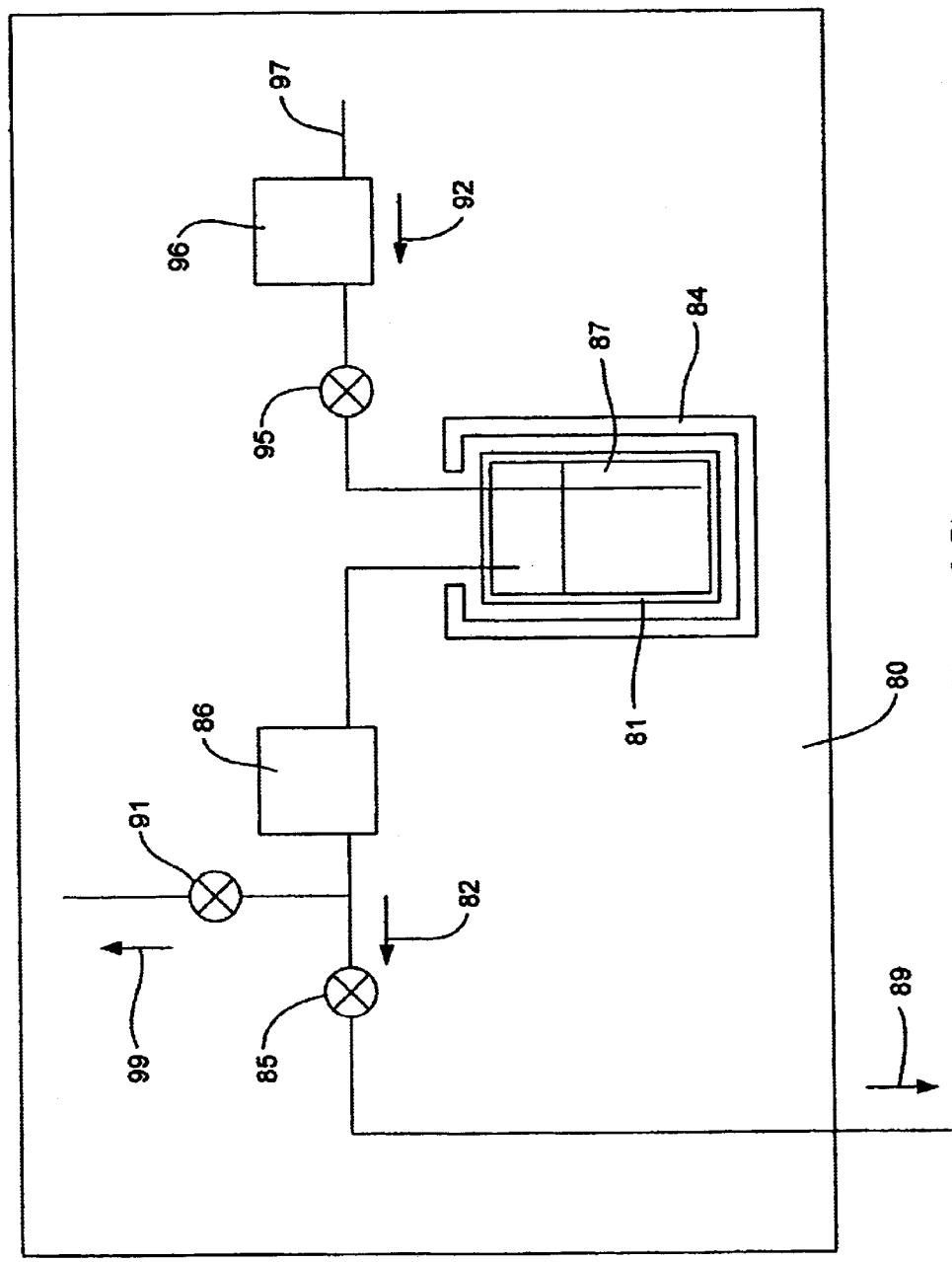

FIGS. 6A–6C show precursor delivery systems. FIG. 6A shows a liquid precursor delivery system 60. The liquid delivery system 60 comprises a container 61 containing the liquid precursor 67. The liquid precursor path 62 comprises a shut off valve 65 to shut off the liquid flow, a metering valve 66 to control the amount of liquid flow, and a vaporizer 68 to convert the liquid into vapor. The liquid precursor is converted to precursor vapor at the outlet of the vaporizer 68 and deliver to the process chamber. The precursor vapor path 69 starts at the outlet of the vaporizer. The liquid delivery system comprises a liquid precursor path 62 from the liquid container 61 to the vaporizer 68 and a precursor vapor path 69 from the vaporizer 68 to the process chamber. A push gas 63 supplies pressure to the precursor container 61 to push the liquid precursor through the liquid precursor path 62. An optional heater jacket 64 can be used to maintain the temperature of the liquid container. A solid precursor can be desolved in a solvent, and can be deliver to a process chamber using liquid precursor delivery system. FIG. 6B shows a gas delivery system 40. The precursor gas path 42 comprises a metering valve 46 to control the amount of gas flow, a shut off valve 45 to shut off the gas flow. A precursor gas 47 supplies the precursor at the inlet of the metering valve 46. The precursor gas path 49 delivering to the process chamber is a continuation of the precursor gas path 42. FIG. 6C shows a vapor precursor delivery system 80. The precursor 87 is contained in a precursor container 81. The precursor 87 can be a liquid precursor or a solid precursor. The precursor vapor travels the precursor vapor path 82. The precursor vapor path 89 delivering to the process chamber is a continuation of the precursor vapor path 82. The precursor vapor by-pass path 99 delivering to a vacuum pump is a by-pass of the precursor vapor path. The precursor vapor by-pass path is used to stabilize the precursor flow. If valve 91 is open and valve 85 is close, the precursor follows the by-pass path and is dumped to the vacuum pump. When the valve 91 is close and valce 85 is open, the precursor follows the precursor path and deposits into the process chamber. The metering valve 86 controls the amount of precursor vapor to be flow in the precursor vapor path 82. A heater jacket 84 controls the vapor pressure of the precursor. A carrier gas 97 can be used to push the precursor vapor through the carrier path 92. A metering valve 96 controls the amount of carrier gas flow and a shut off valve 95 shuts off the carrier gas flow.

It should be realized that the above examples represent a few of a virtually unlimited number of applications of the plasma processing techniques embodied within the scope of the present invention. Furthermore, although the invention has been described with reference to the above specific embodiments, this description is not to be construed in a limiting sense. For example, the duty ratios, cycle times and other parameters/conditions may be changed in order to obtain a desired characteristic for the process on the wafer.

Various modifications of the disclosed embodiment, as well as alternative embodiments of the invention will become apparent to persons skilled in the art upon reference to the above description. The invention, however, is not limited to the embodiment depicted and described. For instance, the radiation source can be a radio frequency heater rather than a lamp. Hence, the scope of the invention is defined by the appended claims. It is further contemplated that the appended claims will cover such modifications that fall within the true scope of the invention.

What is claimed is:

1. A method for sequentially processing a workpiece, the method comprising the steps of:
    a) processing the workpiece on a workpiece mover in a first compartment;
    b) rotating the workpiece on the workpiece mover through an internal pathway from the first compartment to a second compartment, the second compartment being isolated from the first compartment by a first pathway door coupled to a first side of the workpiece mover, said first pathway door closing the internal pathway;
    c) processing the workpiece in the second compartment; and
    d) rotating the workpiece on the workpiece mover through the internal pathway from the second compartment to the first compartment, the first compartment being isolated from the second compartment by a second pathway door coupled to a second side of the workpiece mover, said second pathway door closing the internal pathway.

2. The method as in claim 1, further comprising the steps of:
    e) repeating the rotating and processing steps until a thin film of a desired thickness and having desired characteristics is deposited.

3. The method as in claim 1, wherein the processing steps further comprise depositing a thin film.

4. The method as in claim 2 further comprising removing a cross-contamination between the first compartment and the second compartment by a pumping step after at least one of the rotating step (b) and the rotating step (d), wherein the pumping step is brief relative to a full purging of the first compartment and second compartment.

5. The method as in claim 1, wherein the processing steps further comprise adsorbing a thin film.

6. The method as in claim 1, wherein the processing step c) further comprises reacting a precursor on a film resulting from the processing step a).

7. The method as in claim 1, wherein the processing step c) further comprises reacting a plasma of a precursor on a film resulting from the processing step a).

8. The method as in claim 1 further comprising removing a cross-contamination between the first compartment and the second compartment.

9. A method for sequentially processing a workpiece, the method comprising the steps of:
    a) flowing a plurality of first precursors on the workpiece in a first compartment;
    b) transferring the workpiece on a workpiece mover through an internal pathway from the first compartment to a second compartment by rotating the workpiece mover through the internal pathway, the second compartment being isolated from the first compartment by a first door coupled to the workpiece mover, said first door adapted to isolate the first compartment and second compartment from each other resulting from the rotating the workpiece mover through the internal pathway from the first compartment to the second compartment; and
    c) flowing a plurality of second precursors on the workpiece in the second compartment; and
    d) transferring the workpiece on the workpiece mover through the internal pathway from the second compartment to the first compartment by rotating the workpiece mover through the internal pathway, the first compartment being isolated from the second compartment by a second door coupled to the workpiece mover, said second door adapted to isolate the first compartment and second compartment from each other resulting from the rotating the workpiece mover through the internal pathway from the second compartment to the first compartment; and e) repeating the flowing and transferring steps until a desired thin film is completed.

10. The method as in claim 9, wherein the flowing step a) further comprises depositing a thin film.

11. The method as in claim 9, wherein the flowing step a) further comprises adsorbing a thin film.

12. The method as in claim 9, wherein the flowing step c) further comprises reacting a precursor on a film resulting from the flowing step a).

13. The method as in claim 9, wherein the flowing step c) further comprises reacting a plasma of a precursor on a film resulting from the flowing step a).

14. The method as in claim 9 further comprising removing a cross-contamination between the first compartment and the second compartment by a pumping step after the transferring step (b), wherein the pumping step is brief relative to a full purging of the first compartment and second compartment.

15. A method for sequentially processing a workpiece, the method comprising the steps of:
a) introducing a first thin film on the workpiece on a workpiece mover in a first compartment;
b) transferring the workpiece from the first compartment to a second compartment by rotating the workpiece mover, the second compartment being isolated from the first compartment by a first barrier coupled to a first side of the workpiece mover;
c) removing a thin film on the workpiece in the second compartment.

16. The method as in claim 15, wherein the introducing step a) further comprises depositing the thin film.

17. The method as in claim 15, wherein the introducing step a) further comprises adsorbing the thin film.

18. The method as in claim 15, wherein the removing step c) further comprises etching a film resulting from the processing step a).

19. The method as in claim 15, wherein the removing step c) further comprises using a plasma enhanced etching reaction on a film resulting from the introducing step a).

20. The method as in claim 15 further comprising removing a cross-contamination between the first compartment and the second compartment by a pumping step after the transferring step (b), wherein the pumping step is brief relative to a full purging of the first compartment and second compartment.

21. The method of claim 15 wherein the transferring step further comprises rotating the workpiece mover through an internal pathway between the first compartment and the second compartment.

22. An improved method for sequentially processing a workpiece, the improvement comprising enhancing throughput of the processing by rotating said workpiece on a workpiece mover through an internal pathway between at least two processing chambers and isolating each chamber for each of a plurality of processing steps.

23. A method for sequentially processing a workpiece, the method comprising:
introducing the workpiece into a first compartment supported by a workpiece mover, the workpiece mover in a first position;
processing the workpiece in isolation in the first compartment;
transferring the workpiece supported by the workpiece mover to a second compartment by rotating the workpiece mover through an internal pathway, wherein the workpiece mover in the second compartment is in a second position;
processing the workpiece in isolation in the second compartment;
transferring the workpiece sustained by the workpiece mover to the first compartment through the internal pathway by rotating the workpiece mover, wherein the workpiece mover in the first compartment is in the first position;
repeating the transferring step between the first compartment and the second compartment, and the processing steps in the first compartment and second compartment, until a desired final film is achieved.

24. The method as in claim 23 further comprising:
maintaining the first compartment and second compartment in isolation from each other with internal pathway doors, said internal pathway doors coupled to the workpiece mover so that a first internal pathway door closes the internal pathway when the workpiece mover is in the first position, and a second internal pathway door closes the internal pathway when the workpiece mover is in the second position.

25. The method as in claim 23 wherein the transferring step further comprises:
moving the workpiece mover from the first compartment in the first position to the second compartment in the second position, wherein in the first position, a first internal pathway door coupled to the workpiece mover closes the internal pathway, and in the second position, a second internal pathway door coupled to the workpiece mover closes the internal pathway, wherein the closed internal pathway keeps the first compartment and the second compartment in isolation from each other.

26. The method as in claim 23 further comprising removing a cross-contamination between the first compartment and the second compartment by a pumping step after at least one of each transferring step.

27. A method for sequentially processing a workpiece, the method comprising:
introducing the workpiece into a first compartment supported by a workpiece mover, the workpiece mover in a first position;
processing the workpiece in isolation in the first compartment;
transferring the workpiece supported by the workpiece mover to a second compartment through an internal pathway, wherein the workpiece mover rotates to a second position in the second compartment;
processing the workpiece in isolation in the second compartment, and maintaining the first compartment and second compartment in isolation from each other with internal pathway doors, said internal pathway doors coupled to the workpiece mover so that a first internal pathway door closes the internal pathway when the workpiece mover is in the first position, and a second internal pathway door closes the internal pathway when the workpiece is in the second position.

28. A method for sequentially processing a workpiece, the method comprising:
introducing the workpiece into a first compartment supported by a workpiece mover, the workpiece mover in a first position;

processing the workpiece in isolation in the first compartment;

transferring the workpiece supported by the workpiece mover to a second compartment through an internal pathway, wherein the workpiece mover in the second compartment is in a second position;

processing the workpiece in isolation in the second compartment; and wherein the transferring step further comprises:

moving the workpiece mover from the first compartment in the first position to the second compartment in the second position, wherein in the first position, a first internal pathway door coupled to the workpiece mover closes the internal pathway, and in the second position, a second internal pathway door coupled to the workpiece mover closes the internal pathway.

29. The method as in claim 28 wherein the moving step further comprises rotating the workpiece mover from the first position to the second position, and from the second position to the first position.

30. The method as in claim 28 further comprising removing a cross-contamination between the first compartment and the second compartment by a pumping step after at least one of each transferring step.

31. The method as in claim 28 further comprising removing a cross-contamination between the first compartment and the second compartment by a pumping step after at least one of each transferring step.

32. An improved method for sequentially processing a workpiece, the improvement comprising:

enhancing throughput of the processing by rotating said workpiece mover through an internal pathway between at least two processing chambers; and isolating each chamber for each of a plurality of processing steps with a door coupled to the workpiece mover, said door sealing the internal pathway at completion of the rotating step.

33. An improved method for sequentially processing a workpiece, the improvement comprising:

enhancing throughput of the processing by transferring said workpiece on a workpiece mover through an internal pathway between at least two processing chambers; and isolating each chamber for each of a plurality of processing steps with a door coupled to the workpiece mover, said door sealing the internal pathway at completion of the transferring step.

34. A method for sequentially processing a workpiece, the method comprising the steps of:

processing the workpiece on a workpiece mover in a first compartment;

transferring the workpiece on the workpiece mover through an internal pathway from the first compartment to a second compartment, the second compartment being isolated from the first compartment by a first pathway door coupled to a first side of the workpiece mover, said first pathway door closing the internal pathway;

processing the workpiece in the second compartment;

transferring the workpiece on the workpiece mover though the internal pathway from the second compartment to the first compartment, the first compartment being isolated from the second compartment by a second pathway door coupled to a second side of the workpiece mover, said second pathway door closing the internal pathway; and repeating the processing and transferring steps until a desired film is deposited on the workpiece.

35. A method for sequentially processing a workpiece, the method comprising:

processing the workpiece in a first compartment;

transferring the workpiece on a workpiece mover through an internal pathway to a second compartment, the second compartment being isolated from the first compartment by a door coupled to the workpiece mover, said door closing the internal pathway; and processing the workpiece in the second compartment.

\* \* \* \* \*